US 8,575,566 B2

(12) United States Patent
Chen et al.

(10) Patent No.: US 8,575,566 B2
(45) Date of Patent: Nov. 5, 2013

(54) SPECIMEN BOX FOR ELECTRON MICROSCOPE

(75) Inventors: Chih Chen, Hsinchu (TW); King-Ning Tu, Hsinchu (TW)

(73) Assignee: National Chiao Tung University, Hsinchu (TW)

(*) Notice: Subject to any disclaimer, the term of this patent is extended or adjusted under 35 U.S.C. 154(b) by 0 days.

(21) Appl. No.: 13/541,016

(22) Filed: Jul. 3, 2012

(65) Prior Publication Data

US 2013/0009072 A1    Jan. 10, 2013

(30) Foreign Application Priority Data

Jul. 5, 2011  (TW) .............................. 100123728 A

(51) Int. Cl.
*G21K 5/08*    (2006.01)
(52) U.S. Cl.
USPC ............. 250/442.11; 250/440.11; 250/441.11
(58) Field of Classification Search
USPC ........................... 250/440.11, 441.11, 442.11
See application file for complete search history.

(56) References Cited

U.S. PATENT DOCUMENTS 8,405,047 B2 *  3/2013  Chen et al. ............... 250/440.11

* cited by examiner

*Primary Examiner* — David A Vanore
(74) *Attorney, Agent, or Firm* — Muncy, Geissler, Olds & Lowe, PLLC

(57) ABSTRACT

The present invention relates to a specimen box for an electron microscope, which comprises a first substrate, a second substrate, and a metal adhesion layer. The first substrate has a first surface, a second surface, a first concave, and one or more first through holes, wherein the first through hole penetrates through the first substrate. The second substrate has a third surface, a forth surface, and a second concave. Besides, the metal adhesion layer is disposed between the first substrate and the second substrate to form a space for a specimen placed therein. In addition, the specimen box of the present invention further comprises one or more plugs. When the plug is assembled into the first through hole to seal the specimen box, the in-situ observation can be accomplished by using an electron microscope.

21 Claims, 4 Drawing Sheets

SPECIMEN BOX FOR ELECTRON MICROSCOPE

CROSS REFERENCE TO RELATED APPLICATION

This application claims the benefits of the Taiwan Patent Application Serial Number 100123728, filed on Jul. 5, 2011, the subject matter of which is incorporated herein by reference.

BACKGROUND OF THE INVENTION

1. Field of the Invention

The present invention relates to a specimen box for an electron microscope, especially to a specimen box with one or more through holes, for use with an electron microscope.

2. Description of Related Art

As known in the prior art, a vacuum environment inside an electron microscope is critical for high resolution and accuracy during the observation of specimens under an electron microscope. Considering the vacuum environment, the conventional electron microscope is usually used to observe the structures of solid substances or specimens, such as dehydrated bio-tissue or dehydrated virus. Therefore, the conventional electron microscope has a limitation on the selection of specimens and is invalid for the dynamic observation of specimens.

The application of the electron microscope is restricted by the limitation on the selection of specimens. In order to resolve the above-mentioned drawbacks, a specimen box for an electron microscope suitable for the observation of specimens (such as chemical particles, biochemical molecules, or bio-tissues) in a gas or liquid state was proposed. After the specimen is injected into this specimen box, a sealant or a polymer sealant is used for sealing the specimen box. However, the sealant may easily absorb liquid from the specimen, and the vacuum degree of the electron microscope may be degraded due to the easy evaporation of liquid from the specimen into the vacuum environment through the polymer sealant. Accordingly, the resolution and the observation efficiency of the electron microscope would be greatly affected by the above-mentioned factors.

Another specimen box for an electron microscope was also suggested to solve the above-mentioned issues. The specimen box further includes a gas chamber and a buffer chamber in addition to the specimen chamber. The gas chamber of this specimen box is filled with inert gas to slow down gas diffusion and liquid evaporation from specimens. However, the inert gas in the gas chamber may affect the resolution although the sealing issue is resolved with respect to the specimen box. In addition, the structure of this specimen box is complicated so the cost is increased.

In all of the current and above specimen boxes, none could be opened again (=reopen) after the gas or liquid specimen is injected and the specimen boxes are sealed. In the completely sealed condition, the closed space contains finite oxygen and medium, and thus the lifetime of the living tissues or cells is shortened. Due to their short lifetime, the long-term dynamic changes of the specimens cannot be observed and thus the observation of living tissues or cells is limited.

Not only that, in all of the current and above specimen boxes, the sealant and the polymer sealant used for sealing the boxes have the defect of absorbing the liquid from the specimens. Therefore, the vacuum degree of the electron microscope is easy to be degraded and the original storage condition of the specimens would be damaged due to the liquid evaporation from the specimens to the vacuum environment of the electron microscope.

According to the above, providing a specimen box with high sealing and reopening features could not only effectively improve the observation of gas or liquid specimens under an electron microscope, but also greatly increase the kinds of specimens applicable to electron microscope observation.

SUMMARY OF THE INVENTION

The object of the present invention is to provide a specimen box for an electron microscope, in which the specimen box comprises through holes and plugs. Hence, the specimen box can be reopened to inject gas or liquid again so as to prolong the in-situ observation time effectively.

Another object of the present invention is to provide a tight sealing specimen box. Hence, in the electron microscope observation process, the gas or liquid specimens in the specimen box could not evaporate in the vacuum environment so as to effectively maintain the vacuum environment required for optimal operation of an electron microscope.

To achieve the object, the current specimen box for an electron microscope comprises: a first substrate, a second substrate, and a metal adhesion layer. The first substrate has a first surface, a second surface, a first concave, and one or more first through holes, wherein the first concave is disposed on the second surface, a first thin film corresponding to the first concave is disposed on the first surface, and the first through hole is disposed around the first concave and penetrates through the first substrate. The second substrate has a third surface, a fourth surface, and a second concave, wherein the second concave is disposed on the fourth surface, and a second thin film corresponding to the second concave is disposed on the third surface. The metal adhesion layer is disposed between the first substrate and the second substrate. In addition, a space, which is formed by the first substrate, the second substrate, and the metal adhesion layer, could contain the gas or liquid specimens in the specimen box. The specimen used for the specimen box, such as chemical atoms, molecules, complexes, mixtures, bio-tissues, cells, or enzymes, is not particularly limited as long as it could be observed by the electron microscope.

According to the specimen box of the present invention, the first through hole penetrates through the first thin film and the first substrate to connect the space in the specimen box with the outside space. Therefore, the specimen box could be opened by the first through hole, and the specimens, gas, or liquid could be inserted or injected into the specimen box.

In the present invention, the first concave and the second concave are formed by photolithography process accompanied by wet etching process, dry etching process, or deep reactive-ion etching process. The shape of the first concave and the second concave could be regular shape or irregular shape. Preferably, the shape of the first concave and the second concave is independently a cylinder, a cone, a cube, or a cuboid.

The metal adhesion layer of the specimen box could be disposed between the second surface and the fourth surface, the second surface and the second thin film, or the first thin film and the second thin film, in order to form a space with different volume and shape. Hence, according to the different specimen volume and different observed resolution, the volume and the shape of the space could be adjusted by the disposition of the metal adhesion layer. The volume of the space is 0.01 mm$^3$ to 100 mm$^3$. Preferably, the volume of the space is 0.05 mm$^3$ to 50 mm$^3$. Most preferably, the volume of the space is 0.1 mm$^3$ to 10 mm$^3$. The height of the space is between 10 µm to 1000 µm. Preferably, the height of the space is between 20 µm to 700 µm. Most preferably, the height of the space is between 30 µm to 550 µm.

The material of the metal adhesion layer preferably comprises a metal material to form a solder, in which the metal material is selected from a group consisting of Ti, Cr, Sn, In, Bi, Cu, Ag, Ni, Zn, Au, and Ti—W alloy. Preferably, the metal material is Sn, Ni, Zn, Au, In, or a combination thereof. Most preferably, the metal material is Sn, Au, or a combination thereof. In addition, the metal adhesion layer could further comprise an adhesion layer, a metallurgy layer, and a solder layer, in which the material of the adhesion layer is Ti, Ti—W alloy, or Cr; and the material of the metallurgy layer is Ni, Cu, or Au. The metal material used in the present invention has excellent features of waterproofing, high sealing, and biocompatibility. However, the material of the metal adhesion layer has to be heated to a high temperature so as to allow the upper substrate and the lower substrate to adhere together. The high temperature thus may destroy the specimens in the specimen box. Hence, the preferably method to solve this problem is that the metal adhesion layer adheres the first substrate and the second substrate together at 70° C., then the specimen is inserted or injected into the specimen box. Therefore, the specimen would not be destroyed by the high temperature.

In the present invention, the second substrate could further comprise one or more second through holes, in which the second through hole is disposed around the second concave and penetrates through the second substrate. Therefore, the space of the specimen box could connect with the outside space, and the specimen, gas, and liquid could be inserted or injected into the space through the second through hole.

The hole size of the mentioned first through hole is 10 µm to 1000 µm. Preferably, the hole size of the first through hole is 50 µm to 700 µm. Most preferably, the hole size of the first through hole is 100 µm to 500 µm. In addition, the hole size of the mentioned second through hole is 10 µm to 1000 µm. Preferably, the hole size of the second through hole is 50 µm to 700 µm. Most preferably, the hole size of the second through hole is 100 µm to 500 µm. The hole size of the first through hole and the second through hole could be adjusted according to the different requirements for observation. The method for forming the first through hole and the second through hole is preferably a deep reactive-ion etching process or laser drilling process. In fact, the first through hole and the second through hole are passages to inject a gas specimen or a liquid specimen. Additionally, the first through hole and the second through hole also could be used to inject gas or liquid such as oxygen, nitrogen, buffer, or medium, as is required by the specimen. Therefore, the observation time of the specimen could be prolonged. For example, if oxygen and medium are injected into the space via the through hole, the lifetime of the cell specimen in the specimen box could not only be prolonged, but also the in-situ observation time is prolonged. The dynamic changes of the cell specimen could therefore also be observed.

In the present invention, the specimen box for an electron microscope of the present invention could further comprise one or more plugs assembled into the first through holes and the second through holes. The material of the plug is not especially limited, which could be metal, memory metal, polymer, plastic, ceramic, acrylic, or a combination thereof. Preferable, the material of the plug is memory metal, polymer, plastic, ceramic, or a combination thereof. Most preferably, the material of the plug is memory metal. Then, the material of memory metal could select from a group consisting of Ni—Ti alloy, copper-base alloy, Cu—Zn alloy, Cu—Al—Mn alloy, Cu—Al—Ni alloy, Cu—Al—Be alloy, Cu—Al—Be—Zr alloy, and Cu—Al—Ni—Be alloy. Preferably, the material of memory metal is Ti—Ni alloy, Cu—Zn alloy, Cu—Al—Ni alloy, or a combination thereof. Most preferably, the material of memory metal is Ni—Ti alloy. Because memory metal has a property of thermal expansion and contraction, the plugs of the present invention preferably are used for sealing the through hole, and a tight sealing of the specimen box in the present invention could be accomplished.

In the specimen box for electron microscope of the present invention, the material of the first thin film and the second thin film is independently silicon dioxide ($SiO_2$), silicon nitride ($Si_3N_4$), or a combination thereof. The function of the first thin film and the second thin film is increasing the selectivity in the etching process and enhancing the hardness of the surface of the first substrate and the second substrate. In addition, the thickness of the first thin film and the second thin film is independently 1 nm to 100 nm. Preferably, the thickness of the first thin film and the second thin film is independently 5 nm to 80 nm.

In the present invention, the specimen box further comprises a first protective layer on the surface of the first thin film, in which the first protective layer is disposed on the surface of the first thin film. Similarly, the specimen box also comprises a second protective layer on the surface of the second thin film, in which the second protective layer is disposed on the surface of the second thin film. Preferably, the material of the first protective layer and the second protective layer is silicon nitride ($Si_3N_4$), in which silicon nitride ($Si_3N_4$) is hard enough to protect the first thin film and the second thin film, and could prevent cracking of the first thin film and the second thin film. Furthermore, the first protective layer and the second protective layer could increase the selectivity in the etching process.

In the specimen box of the present invention, the first substrate and the second substrate is independently silicon substrate, glass substrate, or polymer substrate. Preferably, the first substrate and the second substrate is silicon substrate. In addition, the thickness of the first substrate and the second substrate is independently about 10 µm to 1000 µm. Preferably, the thickness of the first substrate and the second substrate is independently about 100 µm to 250 µm.

According to above, in the present invention, the specimen box comprises the metal adhesion layer so as to adhere the first substrate and the second substrate at high temperature before the specimen is inserted or injected into the specimen box. Hence, the specimen would not be destroyed in this heating process. Besides, the specimen box comprises the first through hole and the second through hole, which are passages to insert or inject specimens into the space of the specimen box. When the specimen is inserted or injected into the specimen box, the plugs, especially the memory metal plugs, would be assembled into the first through holes and the second through holes to tightly seal the specimen box by the feature of thermal expansion and contraction of the plugs. Therefore, the specimen was totally sealed in the specimen box so as to be observed through the electron microscope. When the specimen box is removed from the electron microscope, the plugs could be removed to reopen the specimen box temporarily. Gas or liquid, as may be required by the specimen, could be injected through the reopened first through hole and the second through hole, and the lifetime and the in-situ observation time of the specimen could be prolonged in the specimen box. That is, when liquid or gaseous specimens in the specimen box of the present invention are observed by electron microscope, the dynamic changes of those specimens could easily be observed. Therefore, the in-situ observation of those specimens could be completed.

In addition, the manufacturing method of the specimen box in the present invention is less complicated than the prior art, and the materials of the specimen box are also easy to obtain. According to the above improvements of the specimen box in the present invention, the kinds of specimens which could be observed by an electron microscope are increased.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Example 1

Figure 1:
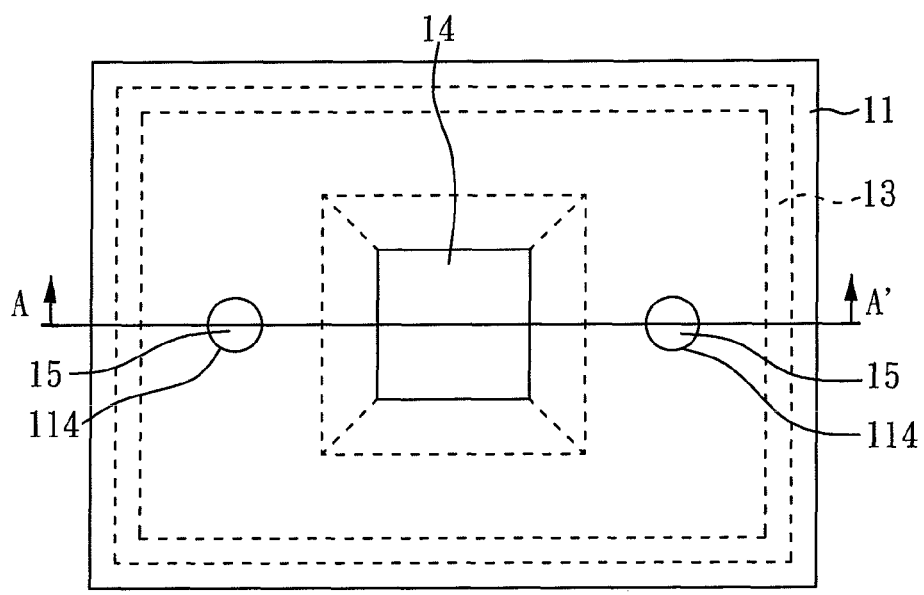
FIG. 1 is a top view showing the specimen box for an electron microscope of the present invention.
Figure 2:
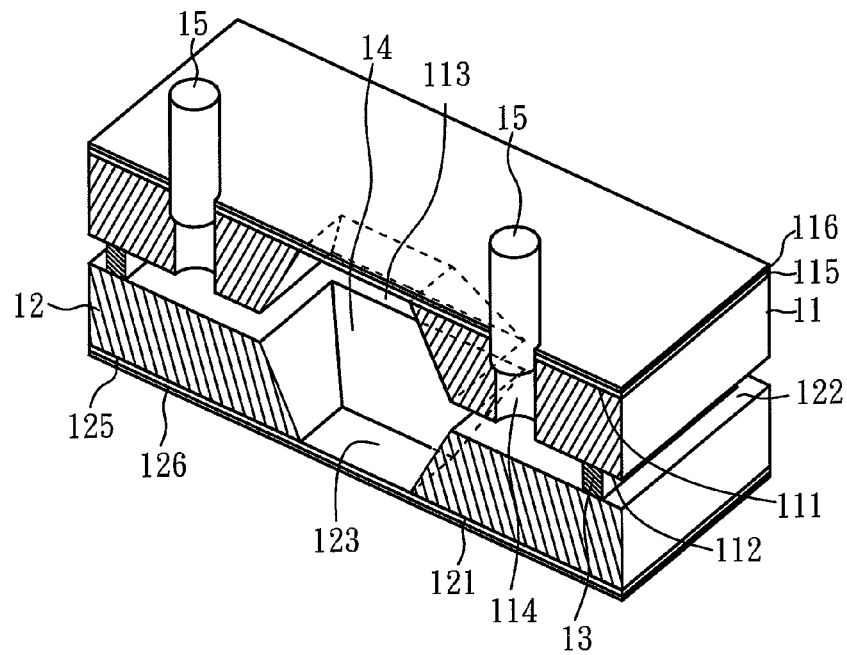
FIG. 2 is a three-dimensional view showing the specimen box of example 1.
Figure 3:
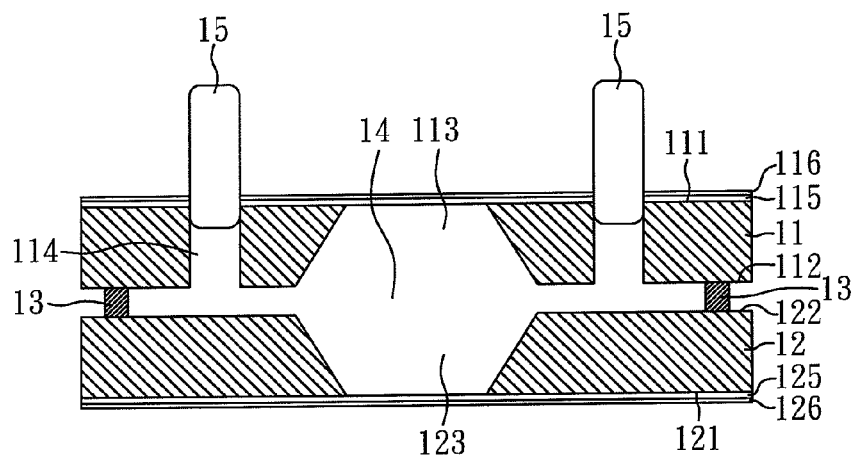
FIG. 3 is a perspective view showing the specimen box of example 1.

As shown in FIG. 1, FIG. 2, and FIG. 3, FIG. 1 is a top view showing the specimen box for an electron microscope of the present invention; FIG. 2 is a three-dimensional view, which along the A-A' section line in FIG. 1, is showing the specimen box for an electron microscope of the example 1; and FIG. 3 is a perspective view, which along the A-A' section line in FIG. 1, is showing the specimen box for an electron microscope of the example 1. According to FIG. 1, FIG. 2, and FIG. 3, the specimen box of the present invention comprises: a first substrate 11, a second substrate 12, and a metal adhesion layer 13. In the present example, the first substrate 11 and the second substrate 12 are silicon substrate. The thickness of the first substrate 11 is 250 μm, and the thickness of the second substrate 12 is also 250 μm.

The first substrate 11 has a first surface 111, a second surface 112, a first concave 113, and two first through holes 114, in which the first concave 113 is disposed on the second surface 112, and a first thin film 111 corresponding to the first concave 113 is disposed on the first surface 111. In addition, the first through holes 114 is disposed around the first concave 113 and penetrates through the first substrate 11.

The second substrate 12 has a third surface 121, a fourth surface 122, and a second concave 123, in which the second concave 123 is disposed on the fourth surface 122, and a second thin film 125 corresponding to the second concave 123 is disposed on the third surface 121.

Additionally, the metal adhesion layer 13 is disposed between the second surface 112 of the first substrate 11 and the fourth surface 122 of the second substrate 12, in which a space 14 was formed by the second surface 112, the fourth surface 122, and the metal adhesion layer 13. Gas or liquid specimens could be contained in the space 14. In the present example, the specimen is not especially limited as long as the specimens could be observed by an electron microscope.

Photolithography process is used for forming the first concave 113 on the second surface 112 and the second concave 123 on the fourth surface 122. The shape of the first concave 113 and the second concave 123 was cone.

In addition, the deep reactive-ion etching process is used for forming the first through holes 114, in which the first through holes 114 penetrate through the first thin film 115 and the first substrate 11. The hole size of the first through holes 114 is 250 μm.

The function of the first through holes 114 is as passages to insert or inject the specimen into the space 14. Besides, the first through holes 114 could also inject gas (such as oxygen, or nitrogen) or liquid (such as buffer, acidic solution, or basic solution) to further observe the dynamic changes of the specimens.

The material of the first thin film 115 and the second thin film 125 in the present example is $SiO_2$, in which the function is enhancing the hardness of the first substrate 11 and the second substrate 12 to avoid cracking of the substrates and increase the selectivity in the etching process.

The metal adhesion layer 13 in the present example comprises an adhesion layer, a metallurgy layer, and a solder layer, in which the material of the adhesion layer is Ti—W alloy, and the material of the metallurgy layer is Cu. In the present example, the metal adhesion layer 13 adheres the first substrate 11 and the second substrate 12 to form the space 14 by the method of automatic alignment packaging method at 130° C. After the first substrate 11 and the second substrate 12 are adhered together, the specimen would be inserted or injected into the space 14 of the specimen box.

An electron beam from the electron microscope would penetrate through the first concave 113 to the space 14 and penetrate through the second concave 123. The volume of the space 14 is 4 $mm^3$, and the height of the space 14 is 550 μm. In order to enhance the hardness and etching selectivity of the substrate, a first protective layer 116 is disposed on the surface of the first thin film 115, and a second protective layer 126 is disposed on the surface of the second thin film 125. Furthermore, the material of the first protective layer 116 and the second protective layer 126 is silicon nitride ($Si_3N_4$).

Finally, the specimen box has two plugs 15, which could seal the first through holes 114, to totally seal the specimen box. In addition, the plugs 15 also could be removed from the first through holes 114, therefore, the specimen box could be reopened according to the requirement of the in-situ observation. The material of the plugs 15 is Ti—Ni alloy. Because Ti—Ni alloy has the property of thermal expansion and contraction, the volume of the plugs 15 is smaller below freezing point than at room temperature. Therefore, when the plugs 15 below freezing point are assembled in the first through holes 114 of the specimen box with the room temperature, the volume of the plugs 15 would gradually expand according to the gradually warming plugs 15. Afterwards, the specimen box would be sealed completely as long as the first through holes 114 are sealed by the plugs 15.

In the present example, a method of using a specimen box for observing a living specimen is shown. First, the cell specimen is inserted or injected in the space 14 through the first through holes 114. The plugs 15 below freezing point are assembled in the first through holes 114. After the temperature of the plugs 15 are warmed to room temperature, the specimen box would be sealed. Then, the specimen box is placed in the electron microscope to observe the cell specimen. According to the requirements of the observation, one could further inject oxygen or medium by removing and then replacing the plugs 15 to complete the in-situ observation of the cell specimen.

Example 2

Figure 4:
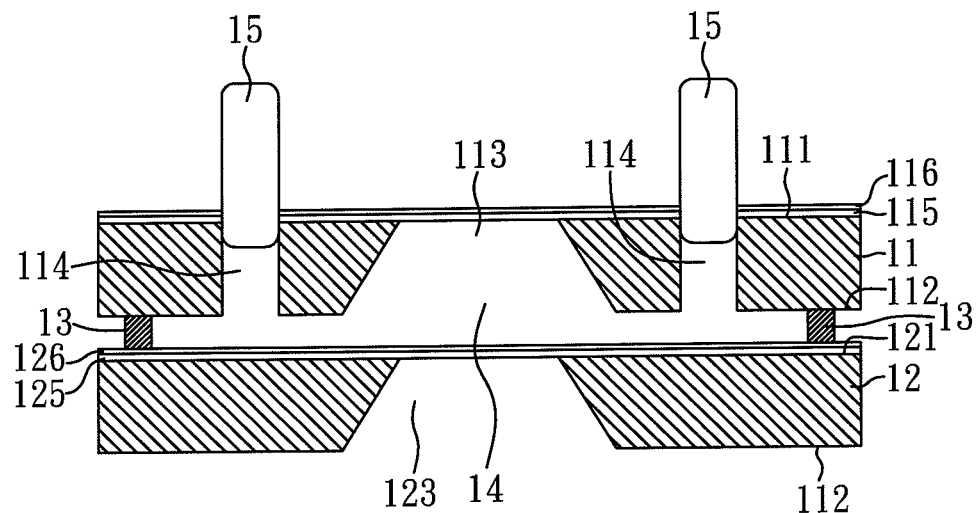
FIG. 4 is a perspective view showing the specimen box for an electron microscope of example 2.

FIG. 4 is a perspective view showing the specimen box for an electron microscope of the example 2. According to FIG. 4, the specimen box of the present example is roughly the same as example 1. The only difference is the disposition of the metal adhesion layer 13. In the present example, the metal adhesion layer 13 is disposed between the second surface 112 and the second protective layer 126, in which the material of the metal adhesion layer 13 is Sn—In eutectic solder.

The volume of the space 14 in the present example is 2 mm$^3$. In the present example, the volume of the space 14 is smaller than example 1, so the resolution is higher than example 1. Therefore, different volumes of the space 14 of the specimen box could be chosen according to different requirements of the observation, such as the volume of the specimen, and the required resolution.

Example 3

Figure 5:
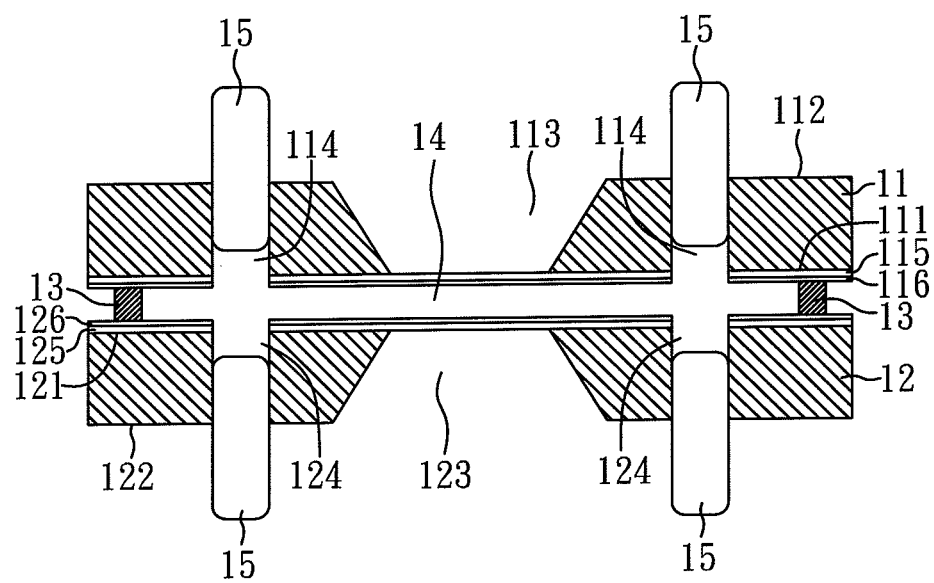
FIG. 5 is a perspective view showing the specimen box for an electron microscope of example 3.

FIG. 5 is a perspective view showing the specimen box for an electron microscope of the example 3. According to FIG. 5, the specimen box of the present example is roughly the same as example 1 and example 2. The only difference is the disposition of the metal adhesion layer 13. The metal adhesion layer 13 is disposed between the first protective layer 116 and the second protective layer 126 to form a space 14 with the volume of 0.02 mm$^3$. The volume of the space 14 is smaller than the space 14 of example 1 and example 2 so the resolution is higher than example 1 and example 2. Therefore, different volumes of the space 14 of the specimen box could be chosen according to different requirements of the observation, such as the volume of the specimen, and the required resolution.

Furthermore, in the present example, the second through holes 124 are formed by deep reactive-ion etching process, and the second through holes 124 are penetrated through the second thin film 125 and the second substrate 12. In addition, the hole size of the second through holes is 250 µm.

Besides, the second through holes 124 are assembled and sealed by the Ni—Ti alloy plugs 15, and the function of the plugs 15 in the present example is the same as the plugs 15 of example 1 and example 2.

Example 4

Figure 6:
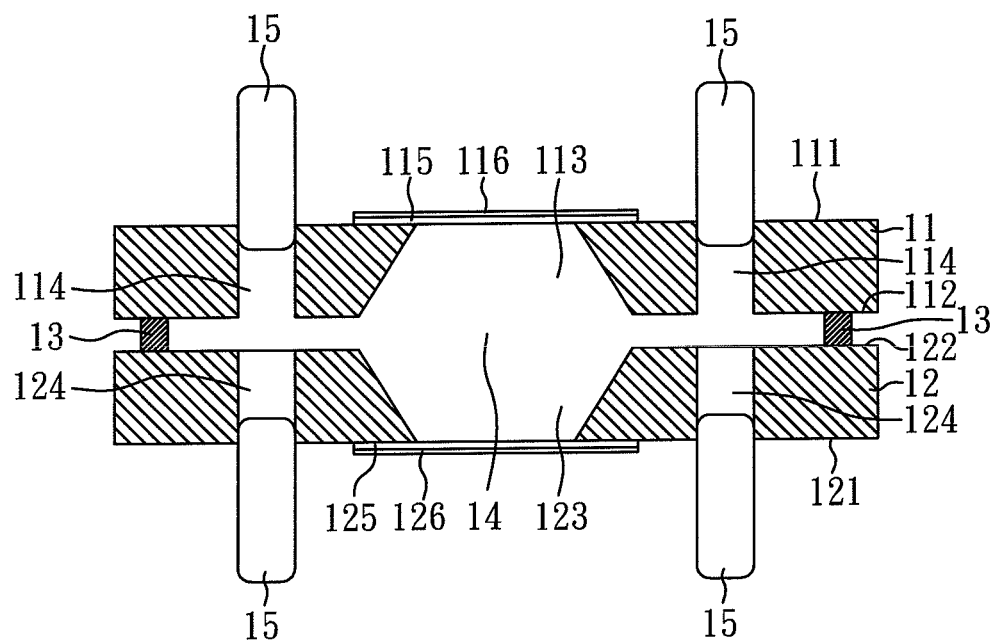
FIG. 6 is a perspective view showing the specimen box for an electron microscope of example 4.

FIG. 6 is a perspective view showing the specimen box for an electron microscope of the example 4. According to the FIG. 6, the specimen box of present example is roughly the same as the example 3. The only difference in the present example is the first thin film 115, the first protective layer 116, the second thin film 125, and the second protective layer 126 are only disposed on the first concave 113 and the second concave 123 to enhance the structure of the first concave 113 and the second concave 123. Therefore, the first thin film 115 and the second thin film 125 would not be cracked so as to avoid the specimen escaping from the space 14.

In addition, the first through holes 114 and the second through holes 124 are formed by a laser drilling process. Therefore, the first through holes 114 are disposed on the first surface 111, and the second through holes 124 are disposed on the third surface 121. The hole size of the first through holes 114 is 250 µm, and the hole size of the second through holes 124 is also 250 µm. Finally, the material of the plugs 15 in the present example is Ni—Ti alloy, and the plugs 15 could also seal the first through holes 114 and the second through holes 124 to seal the specimen box completely.

Although the present invention has been explained in relation to its preferred embodiment, it is to be understood that many other possible modifications and variations can be made without departing from the spirit and scope of the invention as hereinafter claimed.

What is claimed is:

1. A specimen box for an electron microscope, comprising:
   a first substrate, which has a first surface, a second surface, a first concave, and one or more first through holes, wherein the first concave is disposed on the second surface, a first thin film corresponding to the first concave is disposed on the first surface, and the first through hole is disposed around the first concave and penetrates through the first substrate;
   a second substrate, which has a third surface, a fourth surface, and a second concave, wherein the second concave is disposed on the fourth surface, and a second thin film corresponding to the second concave is disposed on the third surface; and
   a metal adhesion layer, which is disposed between the first substrate and the second substrate;
   wherein a space is formed by the first substrate, the second substrate, and the metal adhesion layer, and
   wherein the metal adhesion layer is disposed between the first thin film and the second thin film.

2. The specimen box for an electron microscope as claimed in claim 1, wherein the first through hole penetrates through the first thin film.

3. The specimen box for an electron microscope as claimed in claim 1, wherein the metal adhesion layer is disposed between the second surface and the fourth surface.

4. The specimen box for an electron microscope as claimed in claim 1, wherein the metal adhesion layer is disposed between the second surface and the second thin film.

5. The specimen box for an electron microscope as claimed in claim 1, wherein the second substrate further comprises one or more second through holes, wherein the second through hole is disposed around the second concave and penetrates through the second substrate.

6. The specimen box for an electron microscope as claimed in claim 5, wherein the hole size of the second through hole is 10 µm to 1000 µm.

7. The specimen box for an electron microscope as claimed in claim 5, wherein the specimen box further comprises one or more plugs assembled into the second through holes.

8. The specimen box for an electron microscope as claimed in claim 1, wherein the hole size of the first through hole is 10 µm to 1000 µm.

9. The specimen box for an electron microscope as claimed in claim 1, wherein the specimen box further comprises one or more plugs assembled into the first through holes.

10. The specimen box for an electron microscope as claimed in claim 1, wherein the material of the first thin film and the second thin film is independently silicon dioxide ($SiO_2$), silicon nitride ($Si_3N_4$), or a combination thereof.

11. The specimen box for an electron microscope as claimed in claim 1, wherein the thickness of the first thin film and the second thin film is independently 1 nm to 100 nm.

12. The specimen box for an electron microscope as claimed in claim 1, wherein a first protective layer is disposed on the surface of the first thin film.

13. The specimen box for an electron microscope as claimed in claim 12, wherein the material of the first protective film is silicon nitride ($Si_3N_4$).

14. The specimen box for an electron microscope as claimed in claim 1, wherein a second protective layer is disposed on the surface of the second thin film.

15. The specimen box for an electron microscope as claimed in claim 14, wherein the material of the second protective film is silicon nitride ($Si_3N_4$).

16. The specimen box for an electron microscope as claimed in claim 1, wherein the material of the first substrate and the second substrate is independently silicon substrate, glass substrate, or polymer substrate.

17. The specimen box for an electron microscope as claimed in claim 1, wherein the thickness of the first substrate and the second substrate is independently 10 μm to 1000 μm.

18. The specimen box for an electron microscope as claimed in claim 1, wherein the metal adhesion layer comprises a metal material, wherein the metal material is selected from a group consisting of Ti, Cr, Sn, In, Bi, Cu, Ag, Ni, Zn, Au, and Ti—W alloy.

19. The specimen box for an electron microscope as claimed in claim 1, wherein the material of the plugs is selected from a group consisting of Ni—Ti alloy, copper-base alloy, Cu—Zn alloy, Cu—Al—Mn alloy, Cu—Al—Ni alloy, Cu—Al—Be alloy, Cu—Al—Be—Zr alloy, and Cu—Al—Ni—Be alloy.

20. The specimen box for an electron microscope as claimed in claim 1, wherein the shape of the first concave and the second concave is independently a cylinder, a cone, a cube, or a cuboid.

21. The specimen box for an electron microscope as claimed in claim 1, wherein the volume of the space is 0.01 $mm^3$ to 100 $mm^3$.

\* \* \* \* \*